(12) United States Patent
Fujimagari (10) Patent No.: US 11,955,911 B2
(45) Date of Patent: Apr. 9, 2024

(54) DEMAGNETIZATION DIAGNOSIS DEVICE FOR MOTOR AND DEMAGNETIZATION DIAGNOSIS METHOD FOR MOTOR CONTROL DEVICE

(71) Applicant: MEIDENSHA CORPORATION, Tokyo (JP)

(72) Inventor: Hiromu Fujimagari, Kiyosu (JP)

(73) Assignee: MEIDENSHA CORPORATION, Tokyo (JP)

( * ) Notice: Subject to any disclaimer, the term of this patent is extended or adjusted under 35 U.S.C. 154(b) by 121 days.

(21) Appl. No.: 17/782,737

(22) PCT Filed: Sep. 7, 2020

(86) PCT No.: PCT/JP2020/033706
§ 371 (c)(1),
(2) Date: Jun. 6, 2022

(87) PCT Pub. No.: WO2021/117303
PCT Pub. Date: Jun. 17, 2021

(65) Prior Publication Data
US 2023/0006584 A1    Jan. 5, 2023

(30) Foreign Application Priority Data

Dec. 9, 2019   (JP) .............................. 2019-221776
Jan. 29, 2020  (JP) .............................. 2020-012088

(51) Int. Cl.
*G01R 31/34*   (2020.01)
*G01R 19/00*   (2006.01)
(Continued)

(52) U.S. Cl.
CPC .......... *H02P 21/14* (2013.01); *G01R 19/0092* (2013.01); *G01R 31/34* (2013.01);
(Continued)

(58) Field of Classification Search
CPC .......... H02P 21/14; H02P 27/06; H02P 21/22; G01R 19/0092; G01R 31/34;
(Continued)

(56) References Cited

U.S. PATENT DOCUMENTS

2011/0221366 A1*  9/2011  Gallegos-Lopez ..... H02P 21/36
                                                          318/400.02
2014/0232306 A1   8/2014  Yasui et al.
(Continued)

FOREIGN PATENT DOCUMENTS

JP    2008-043153 A    2/2008
JP    2010-239790 A    10/2010
(Continued)

*Primary Examiner* — Raul J Rios Russo
(74) *Attorney, Agent, or Firm* — Foley & Lardner LLP (57) ABSTRACT

A pulse voltage generator calculates a corrected pulse voltage application time. The pulse voltage generator also outputs, for the duration of the corrected pulse voltage application time, a voltage vector closest to a rotor phase from among twelve voltage vectors as a voltage vector command. A current detector detects three-phase output currents of a power converter, which are obtained when first to sixth switching elements of the power converter are turned on or off on the basis of the voltage vector command. A three-phase/two-phase converter converts the three-phase output currents to two-phase output currents to output d-axis current. When the d-axis current after the corrected pulse voltage application time has elapsed becomes less than or equal to a demagnetization determination threshold value, a demagnetization determiner determines that demagnetization occurs in a permanent magnet of a rotor of a motor.

8 Claims, 4 Drawing Sheets

(51) Int. Cl.
*H02P 21/14* (2016.01)
*H02P 27/06* (2006.01)
*H02K 11/20* (2016.01)
*H02K 11/35* (2016.01)
*H02K 15/00* (2006.01)

(52) U.S. Cl.
CPC ......... *G01R 31/343* (2013.01); *G01R 31/346*
(2013.01); *H02P 27/06* (2013.01); *H02K 11/20*
(2016.01); *H02K 11/35* (2016.01); *H02K 15/00*
(2013.01)

(58) Field of Classification Search
CPC .... G01R 31/343; G01R 31/346; H02K 11/20; H02K 15/00; H02K 11/35
USPC .................................................. 324/765.01
See application file for complete search history.

(56) References Cited

U.S. PATENT DOCUMENTS

| | | | | |
|---|---|---|---|---|
| 2022/0074992 | A1* | 3/2022 | Chen | G01R 31/34 |
| 2022/0393628 | A1* | 12/2022 | Park | H02P 21/14 |

FOREIGN PATENT DOCUMENTS

| | | | |
|---|---|---|---|
| JP | 2011-200019 | A | 10/2011 |
| JP | 2011-254682 | A | 12/2011 |
| JP | 6158115 | B2 | 7/2017 |

* cited by examiner

VOLTAGE VECTOR DIAGRAM

DEMAGNETIZATION DIAGNOSIS DEVICE FOR MOTOR AND DEMAGNETIZATION DIAGNOSIS METHOD FOR MOTOR CONTROL DEVICE

TECHNICAL FIELD

The present invention relates to a demagnetization diagnosis device for a motor and a demagnetization diagnosis method for a motor control device.

BACKGROUND ART

Figure 5:
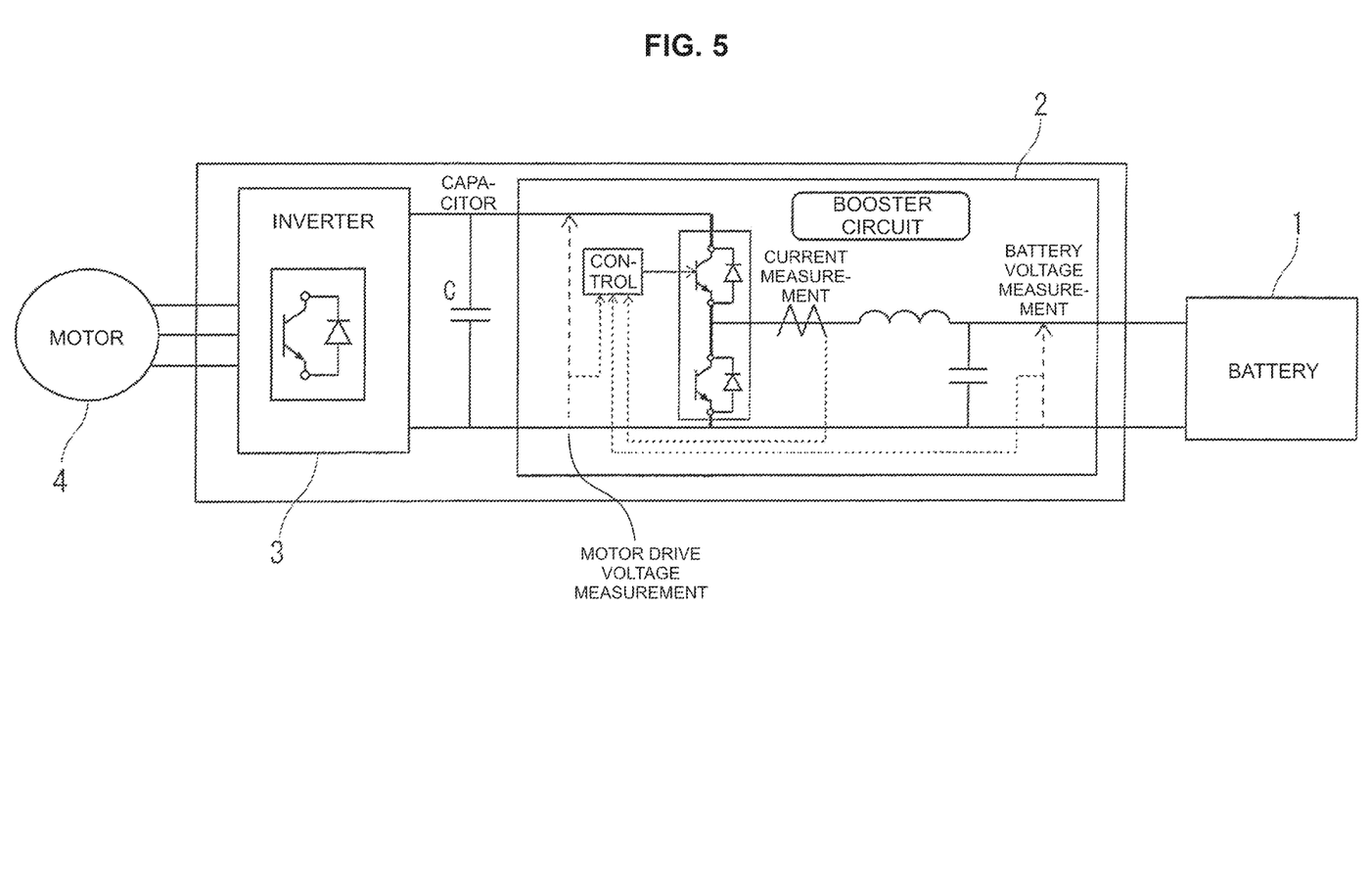
FIG. 5 is a block diagram showing an example of configurations of an in-vehicle motor drive system.
Figure 6:
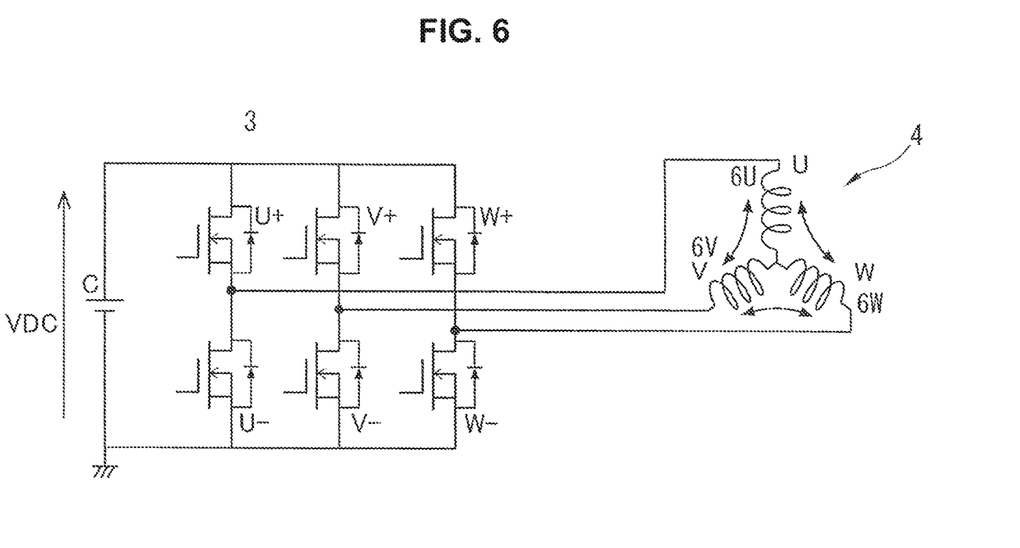
FIG. 6 is a diagram showing an inverter and a motor.

FIG. 5 shows an example of configurations for an in-vehicle motor drive system. Voltage of a battery 1 is boosted by a booster circuit 2 and applied to a capacitor C. Then, voltage of capacitor C is converted to alternating-current voltage by an inverter 3 (i.e., a power converter) and applied to a PM motor 4, which rotates PM motor 4. As shown in FIG. 6, inverter 3 includes first to sixth switch elements U+, U−, V+, V−, W+, and W− connected to arms of U-phase, V-phase, and W-phase.

Figure 7:
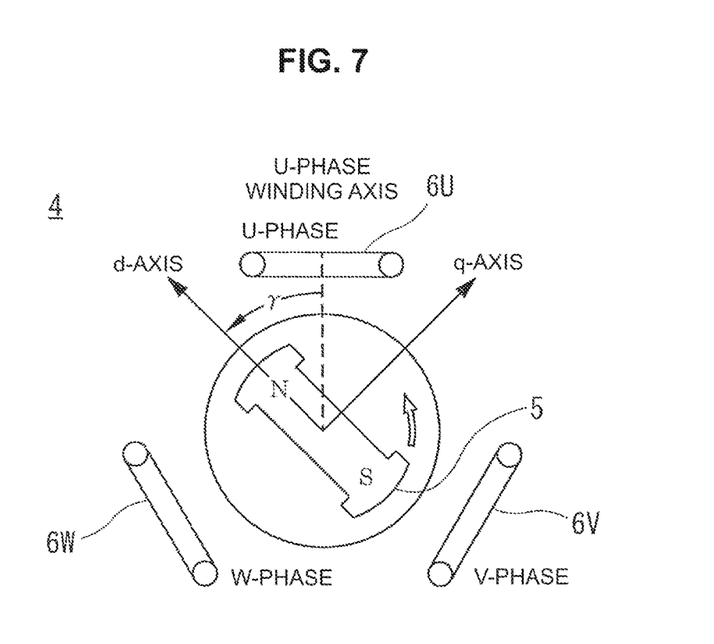
FIG. 7 is a schematic view of the PM motor.

FIG. 7 schematically shows configurations of PM motor 4. PM motor 4 includes in its inner side a rotor 5 composed of a permanent magnet including a north pole and a south pole. Furthermore, PM motor 4 includes in its outer side a stator including a U-phase winding 6U, a V-phase winding 6V, and a W-phase winding 6W connected to inverter 3. Rotor 5 composed of the permanent magnet rotates in response to magnetic field that is generated inside PM motor 4 by applying voltage from inverter 3 to U-phase winding 6U, V-phase winding 6V, and W-phase winding 6W.

The permanent magnet of rotor 5 may undergo deterioration in magnetic flux (i.e., demagnetization) due to aging. This may prevent PM motor 4 from being driven at an intended torque. Therefore, the in-vehicle motor drive system requires a function to detect the demagnetization due to aging.

Patent Document 3 discloses a prior art for demagnetization diagnosis. FIG. 7 of Patent Document 3 shows an art for performing the demagnetization diagnosis by estimating a magnetic flux from a current slope when applying a d-axis pulse voltage Vd for a predetermined time period during a stop of a motor.

Furthermore, it is possible to modify Patent Document 3 to yield another art for performing the demagnetization diagnosis based on a value of d-axis current when applying a d-axis pulse voltage Vd for a predetermined time period during a stop of a motor.

Figure 2:
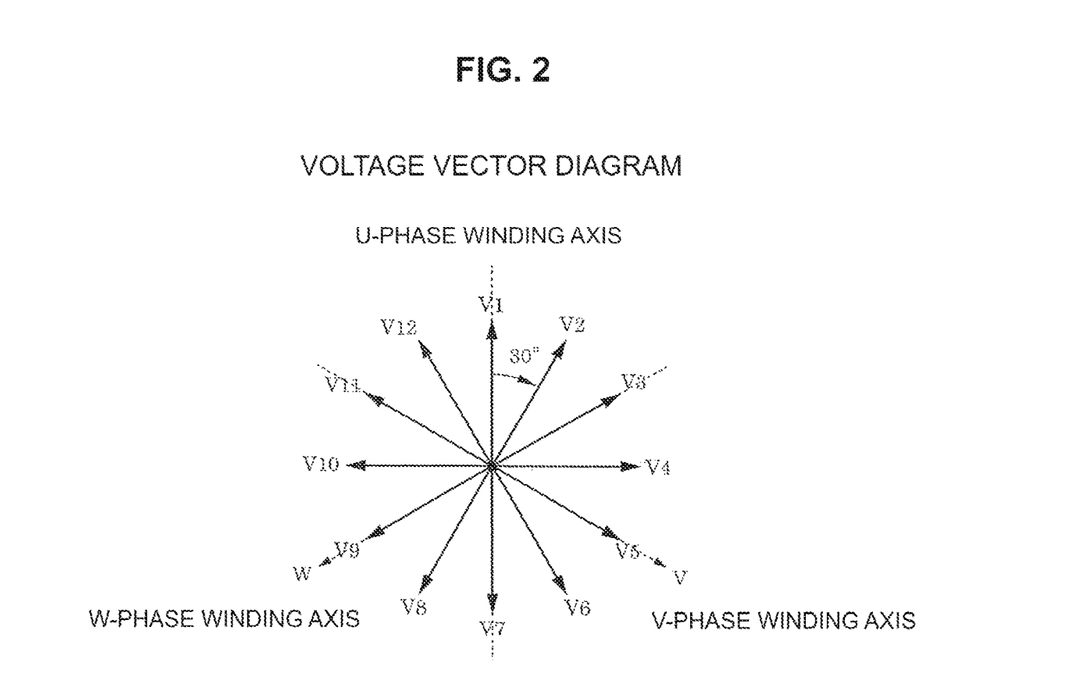
FIG. 2 is an illustrative view of voltage vectors.

However, this modified art is configured to generate the d-axis current value used for the demagnetization diagnosis, based on a voltage vector command shown in FIG. 2 in which the voltage vector command has a phase limited to twelve types. This causes an error in d-axis current value for the demagnetization diagnosis depending on conditions of rotor phase position of the permanent magnet, and thereby suppresses the demagnetization diagnosis from being performed with high accuracy.

In view of the foregoing, it is desirable to improve accuracy of demagnetization diagnosis performed by a demagnetization diagnosis device for a motor.

PRIOR ART DOCUMENT(S)

Patent Document(s)

Patent Document 1: JP 2011-200019 A

Patent Document 2: JP 2008-043153 A

Patent Document 3: JP 6158115 B2

SUMMARY OF THE INVENTION

Problem(s) to be Solved by the Invention

In view of the foregoing conventional problem, according to one aspect of the present invention, a demagnetization diagnosis device for a motor includes a power converter including: a first switch element and a second switch element connected to each other in series between a first end and a second end of a capacitor; a third switch element and a fourth switch element connected to each other in series between the first end and the second end of the capacitor; and a fifth switch element and a sixth switch element connected to each other in series between the first end and the second end of the capacitor; a motor including: a first winding connected to a connection point common between the first switch element and the second switch element; a second winding connected to a connection point common between the third switch element and the fourth switch element; and a third winding connected to a connection point common between the fifth switch element and the sixth switch element; a pulse voltage generator that calculates a corrected pulse voltage application time period by a Mathematical Expression 5 below, and selects a voltage vector nearest to a rotor phase of a rotor of the motor out of voltage vectors V1 to V12 shown in a Table 1 below, and outputs the selected voltage vector as a voltage vector command, for the corrected pulse voltage application time period; a current measurement instrument that measures output currents of three phases of the power converter outputted when the first to sixth switch elements of the power converter are turned ON or OFF in accordance with the Table 1 in response to the voltage vector command; a three-phase/two-phase converter that converts the output currents of the three phases into output currents of two phases, and outputs a d-axis current; and a demagnetization determiner that determines demagnetization as occurring in a permanent magnet of the rotor of the motor, in response to satisfaction of a condition that the d-axis current after passage of the corrected pulse voltage application time period is equal to or less than a demagnetization determination threshold.

[Mathematical Expression 5]

$$Ton' = Ton/\cos(\Delta\theta) \qquad (5)$$

Ton Before-correction pulse voltage application time period (fixed value)

Ton': Corrected pulse voltage application time period

Δθ: Absolute value of difference between current rotor phase γ and phase of voltage vector command

TABLE 1

|     | FIRST SWITCH ELEMENT | SECOND SWITCH ELEMENT | THIRD SWITCH ELEMENT | FOURTH SWITCH ELEMENT | FIFTH SWITCH ELEMENT | SIXTH SWITCH ELEMENT |
| --- | --- | --- | --- | --- | --- | --- |
| V1  | ON  | OFF | OFF | ON  | OFF | ON  |
| V2  | ON  | OFF | OFF | OFF | OFF | ON  |
| V3  | ON  | OFF | ON  | OFF | OFF | ON  |
| V4  | OFF | OFF | ON  | OFF | OFF | ON  |
| V5  | OFF | ON  | ON  | OFF | OFF | ON  |
| V6  | OFF | ON  | ON  | OFF | OFF | OFF |
| V7  | OFF | ON  | ON  | OFF | ON  | OFF |
| V8  | OFF | ON  | OFF | OFF | ON  | OFF |
| V9  | OFF | ON  | OFF | ON  | ON  | OFF |
| V10 | OFF | OFF | OFF | ON  | ON  | OFF |
| V11 | ON  | OFF | OFF | ON  | ON  | OFF |
| V12 | ON  | OFF | OFF | ON  | OFF | OFF |

According to another aspect of the present invention, a demagnetization diagnosis device for a motor includes: a power converter including: a first switch element and a second switch element connected to each other in series between a first end and a second end of a capacitor; a third switch element and a fourth switch element connected to each other in series between the first end and the second end of the capacitor; and a fifth switch element and a sixth switch element connected to each other in series between the first end and the second end of the capacitor; a motor including: a first winding connected to a connection point common between the first switch element and the second switch element; a second winding connected to a connection point common between the third switch element and the fourth switch element; and a third winding connected to a connection point common between the fifth switch element and the sixth switch element; a pulse voltage generator that calculates a corrected pulse voltage application time period by a Mathematical Expression 6 below, and selects a voltage vector nearest to a rotor phase of a rotor of the motor out of voltage vectors V1 to V12 shown in a Table 1 below, and outputs the selected voltage vector as a voltage vector command, for the corrected pulse voltage application time period; a current measurement instrument that measures output currents of three phases of the power converter outputted when the first to sixth switch elements of the power converter are turned ON or OFF in accordance with the Table 1 in response to the voltage vector command; a three-phase/two-phase converter that converts the output currents of the three phases into output currents of two phases, and outputs a d-axis current and a q-axis current; and a demagnetization determiner that determines demagnetization as occurring in a permanent magnet of the rotor of the motor, in response to satisfaction of a condition that an alternating-current effective value calculated from the d-axis current and the q-axis current after passage of the corrected pulse voltage application time period is equal to or less than a demagnetization determination threshold.

[Mathematical Expression 6]

$$Ton' = \frac{Ton}{\sqrt{\cos^2(\Delta\theta) + \left(\frac{Ld}{Lq} * \sin(\Delta\theta)\right)^2}} \quad (6)$$

Ton: Pulse voltage application time period before correction (fixed value)
Ton': Pulse voltage application time period after correction
$\Delta\theta$: Absolute value of difference between current rotor phase $\gamma$ and phase of voltage vector command
Ld d-axis inductance
Lq: q-axis inductance

TABLE 1

|     | FIRST SWITCH ELEMENT | SECOND SWITCH ELEMENT | THIRD SWITCH ELEMENT | FOURTH SWITCH ELEMENT | FIFTH SWITCH ELEMENT | SIXTH SWITCH ELEMENT |
| --- | --- | --- | --- | --- | --- | --- |
| V1  | ON  | OFF | OFF | ON  | OFF | ON  |
| V2  | ON  | OFF | OFF | OFF | OFF | ON  |
| V3  | ON  | OFF | ON  | OFF | OFF | ON  |
| V4  | OFF | OFF | ON  | OFF | OFF | ON  |
| V5  | OFF | ON  | ON  | OFF | OFF | ON  |
| V6  | OFF | ON  | ON  | OFF | OFF | OFF |
| V7  | OFF | ON  | ON  | OFF | ON  | OFF |
| V8  | OFF | ON  | OFF | OFF | ON  | OFF |
| V9  | OFF | ON  | OFF | ON  | ON  | OFF |
| V10 | OFF | OFF | OFF | ON  | ON  | OFF |
| V11 | ON  | OFF | OFF | ON  | ON  | OFF |
| V12 | ON  | OFF | OFF | ON  | OFF | OFF |

According to still another aspect of the present invention, the pulse voltage generator further corrects the corrected pulse voltage application time period, by multiplying the corrected pulse voltage application time period by a first value, where the first value is obtained by dividing a direct-current voltage reference value by a direct-current voltage measured value.

According to still another aspect of the present invention, a demagnetization diagnosis device for a motor includes: a power converter including: a first switch element and a second switch element connected to each other in series between a first end and a second end of a capacitor; a third switch element and a fourth switch element connected to each other in series between the first end and the second end of the capacitor; and a fifth switch element and a sixth switch element connected to each other in series between the first end and the second end of the capacitor; a motor including: a first winding connected to a connection point common between the first switch element and the second switch element; a second winding connected to a connection point common between the third switch element and the fourth switch element; and a third winding connected to a connection point common between the fifth switch element and the sixth switch element; a pulse voltage generator that calculates a corrected pulse voltage application time period by a Mathematical Expression 8 below, and selects a voltage vector nearest to a rotor phase of a rotor of the motor out of voltage vectors V1 to V12 shown in a Table 1 below, and outputs the selected voltage vector as a voltage vector command, for the corrected pulse voltage application time period; a current measurement instrument that measures output currents of three phases of the power converter outputted when the first to sixth switch elements of the power converter are turned ON or OFF in accordance with the Table 1 in response to the voltage vector command; a three-phase/two-phase converter that converts the output currents of the three phases into output currents of two phases, and outputs a d-axis current or both of the d-axis current and a q-axis current; and a demagnetization determiner that determines demagnetization as occurring in a permanent magnet of the rotor of the motor, in response to satisfaction of a condition that the d-axis current or an alternating-current effective value calculated from the d-axis current and the q-axis current after passage of the corrected pulse voltage application time period is equal to or less than a demagnetization determination threshold.

[Mathematical Expression 8]

$$T_{on}'' = T_{on} * VDC/VDC' \qquad (8)$$

Ton Pulse voltage application time period before correction (fixed value)
Ton": Pulse voltage application time period after correction
VDC Direct-current voltage reference value (fixed value)
VDC': Direct-current voltage measured value

TABLE 1

| | FIRST SWITCH ELEMENT | SECOND SWITCH ELEMENT | THIRD SWITCH ELEMENT | FOURTH SWITCH ELEMENT | FIFTH SWITCH ELEMENT | SIXTH SWITCH ELEMENT |
|---|---|---|---|---|---|---|
| V1 | ON | OFF | OFF | ON | OFF | ON |
| V2 | ON | OFF | OFF | OFF | OFF | ON |
| V3 | ON | OFF | ON | OFF | OFF | ON |
| V4 | OFF | OFF | ON | OFF | OFF | ON |
| V5 | OFF | ON | ON | OFF | OFF | ON |
| V6 | OFF | ON | ON | OFF | OFF | OFF |
| V7 | OFF | ON | ON | OFF | ON | OFF |
| V8 | OFF | ON | OFF | OFF | ON | OFF |
| V9 | OFF | ON | OFF | ON | ON | OFF |
| V10 | OFF | OFF | OFF | ON | ON | OFF |
| V11 | ON | OFF | OFF | ON | ON | OFF |
| V12 | ON | OFF | OFF | ON | OFF | OFF |

According to still another aspect of the present invention, the demagnetization determiner sets the demagnetization determination threshold, based on a temperature of a permanent magnet of the motor.

The present invention serves to improve accuracy of demagnetization diagnosis performed by a demagnetization diagnosis device for a motor.

MODE(S) FOR CARRYING OUT THE INVENTION

The following describes first to fourth embodiments of a demagnetization diagnosis device for a motor according to the present invention, with reference to FIGS. 1 to 4 and 6 and 7.

[First Embodiment] The following describes configurations of an inverter 3 and a motor 4 employed in the demagnetization diagnosis device according to the first embodiment. Inverter 3 includes first and second switch elements U+ and U−, third and fourth switch elements V+ and V−, and fifth and sixth switch elements W+ and W−. First switch element U+ and second switch element U− are connected to each other in series between a first end and a second end of a capacitor C. Third switch element V+ and fourth switch element V− are connected to each other in series between the first end and the second end of capacitor C. Fifth switch element W+ and sixth switch element W− are connected to each other in series between the first end and the second end of capacitor C.

Motor 4 includes a U-phase winding 6U (i.e., a first winding), a V-phase winding 6V (i.e., a second winding), and a W-phase winding 6W (i.e., a third winding). U-phase winding 6U is connected to a connection point common between first switch element U+ and second switch element U−. V-phase winding 6V is connected to a connection point common between third switch element V+ and fourth switch element V−. W-phase winding 6W is connected to a connection point common between fifth switch element W+ and sixth switch element W−. U-phase winding 6U and V-phase winding 6V and W-phase winding 6W are connected to each other by star connection. Incidentally, the present embodiment may be applied to devices other than the in-vehicle motor drive system exemplified in FIG. 5, provided that each device includes an inverter and a motor.

Figure 1:
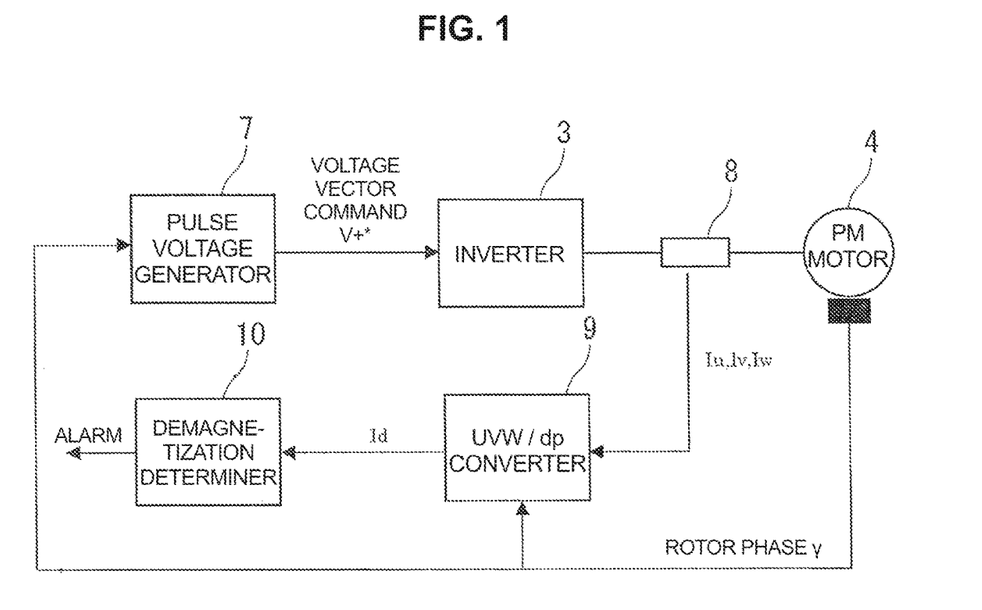
FIG. 1 is a block diagram showing configurations for control of demagnetization diagnosis, according to first to fourth embodiments.

FIG. 1 is a block diagram showing configurations for control of demagnetization diagnosis according to the first embodiment. In the first embodiment, the demagnetization diagnosis is implemented during a stop of PM motor 4. Normal rotational operation of PM motor 4 is controlled by a control block different from one shown in FIG. 1, explanation for which is omitted because of a lack of direct relevance with the present invention.

The following describes the demagnetization diagnosis according to the first embodiment, with reference to FIG. 1. PM motor 4 has a rotor phase γ that is inputted to a pulse voltage generator 7. As shown in FIG. 7, rotor phase γ is difference in phase between an axis (i.e., a d-axis) of a north pole of a rotor 5 and an axis of the U− phase winding. Based on rotor phase γ, pulse voltage generator 7 selects one voltage vector nearest to the d-axis out of twelve voltage vectors V1 to V12 shown in FIG. 2, and outputs the selected voltage vector as a voltage vector command V+* for a predetermined time period Ton' (i.e., a corrected pulse voltage application time period described below). For example, in case of −15°<γ<+15°, the voltage vector V1 is selected for the voltage vector command V+*.

Inverter 3 turns ON/OFF the switch elements depending on the voltage vector of the voltage vector command V+* inputted to inverter 3, and applies a pulsatile output voltage to PM motor 4.

Table 1 below shows relation between the voltage vectors and ON/OFF commands for the first to sixth switch elements U+, U−, V+, V−, W+, and W−. As shown in Table 1, inverter 3 turns ON/OFF the switch elements U+, U−, V+, V−, W+, and W−, based on the voltage vector command V+*.

TABLE 1

|  | FIRST SWITCH ELEMENT | SECOND SWITCH ELEMENT | THIRD SWITCH ELEMENT | FOURTH SWITCH ELEMENT | FIFTH SWITCH ELEMENT | SIXTH SWITCH ELEMENT |
|---|---|---|---|---|---|---|
| V1 | ON | OFF | OFF | ON | OFF | ON |
| V2 | ON | OFF | OFF | OFF | OFF | ON |
| V3 | ON | OFF | ON | OFF | OFF | ON |
| V4 | OFF | OFF | ON | OFF | OFF | ON |
| V5 | OFF | ON | ON | OFF | OFF | ON |
| V6 | OFF | ON | ON | OFF | OFF | OFF |
| V7 | OFF | ON | ON | OFF | ON | OFF |
| V8 | OFF | ON | OFF | OFF | ON | OFF |
| V9 | OFF | ON | OFF | ON | ON | OFF |
| V10 | OFF | OFF | OFF | ON | ON | OFF |
| V11 | ON | OFF | OFF | ON | ON | OFF |
| V12 | ON | OFF | OFF | ON | OFF | OFF |

Current measurement instrument 8 measures winding currents Iu, Iv, and Iw of U, V, and W phases of PM motor 4 (i.e., output currents of three phases of inverter 3) which flow when the first to sixth switch elements U+ to W− of inverter 3 are turned ON or OFF in response to the voltage vector command V+*. The output currents of the three phases satisfies Iu+Iv+Iw=0, because U-phase winding 6U, V-phase winding 6V, and W− phase winding 6W are connected to each other by star connection. It is allowed to use current measurement instruments for respective ones of the three phases and measure respective ones of the output currents of the three phases. In another manner, it is allowed to use current measurement instruments for two phases and measure the output currents of the two phases, and calculate the output current of the rest one phase by the above equation. The latter manner has an advantage in reduction of the number of current measurement instruments.

Three-phase/two-phase converter 9 performs three-phase/two-phase conversion by using the mathematical expressions (1) and (2) below based on output currents Iu, Iv, and Iw of the three phases and rotor phase γ, and outputs d-axis current Id.

[Mathematical Expression 1]

$$C = \sqrt{\frac{2}{3}} \begin{bmatrix} \cos\gamma & \cos(\gamma - 2\pi/3) & \cos(\gamma + 2\pi/3) \\ -\sin\gamma & -\sin(\gamma - 2\pi/3) & -\sin(\gamma + 2\pi/3) \end{bmatrix} \quad (1)$$

[Mathematical Expression 2]

$$\begin{bmatrix} i_d \\ i_q \end{bmatrix} = C \begin{bmatrix} i_u \\ i_v \\ i_w \end{bmatrix} \quad (2)$$

Demagnetization determiner 10 performs the demagnetization diagnosis of a permanent magnet of rotor 5, based on a value of d-axis current Id at a timing after the corrected pulse voltage application time period has passed from a start of output of the voltage vector command V+*. Since the voltage vector for the voltage vector command V+* has been selected to be one nearest to the d-axis, q-axis current Iq satisfies Iq≈0. Accordingly, the winding currents generate almost no torque, and rotor 5 remains at rest.

D-axis inductance Ld may be expressed by the mathematical expression (3) below, provided that conditions of Iq=0 and ω=0 (where ω is rotational frequency of rotor 5) are satisfied and that d-axis current Id has a direct-current component being substantially zero.

[Mathematical Expression 3]

$$Ld = \frac{Vd}{\frac{d}{dt}Id} \quad (3)$$

When regarding d-axis voltage Vd as a constant, d-axis current Id can be calculated from an inverse of a change rate of d-axis inductance Ld.

D-axis inductance Ld may be expressed also by the mathematical expression (4) below, with d-axis current change amount ΔId and magnetic flux change amount ΔΦ. This allows magnetic flux Φ of the motor magnet to be estimated from d-axis inductance Ld.

[Mathematical Expression 4]

$$Ld = \frac{\Delta\phi}{\Delta Id} \quad (4)$$

PM motor 4 in general is characterized by monotonically decreasing in d-axis inductance Ld with increase in d-axis current Id. However, in case of PM motor 4 with a specific structure, it is known that d-axis inductance Ld has a maximum point with respect to d-axis current Id in a positive region thereof, due to magnetic saturation.

Figure 3:
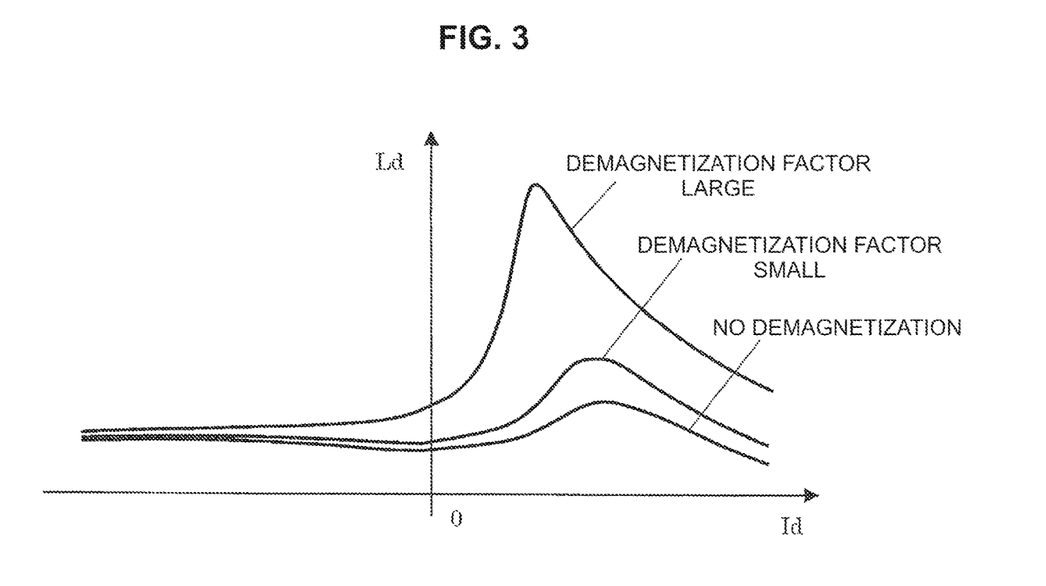
FIG. 3 is a graph showing relation between d-axis current and d-axis inductance.

As shown in FIG. 3, this inductance characteristic is further characterized in that increase in demagnetization factor with respect to a design maximum magnetic flux of the magnet causes increase in maximum value at the maximum point and decrease in d-axis current Id at the maximum point.

Figure 4:
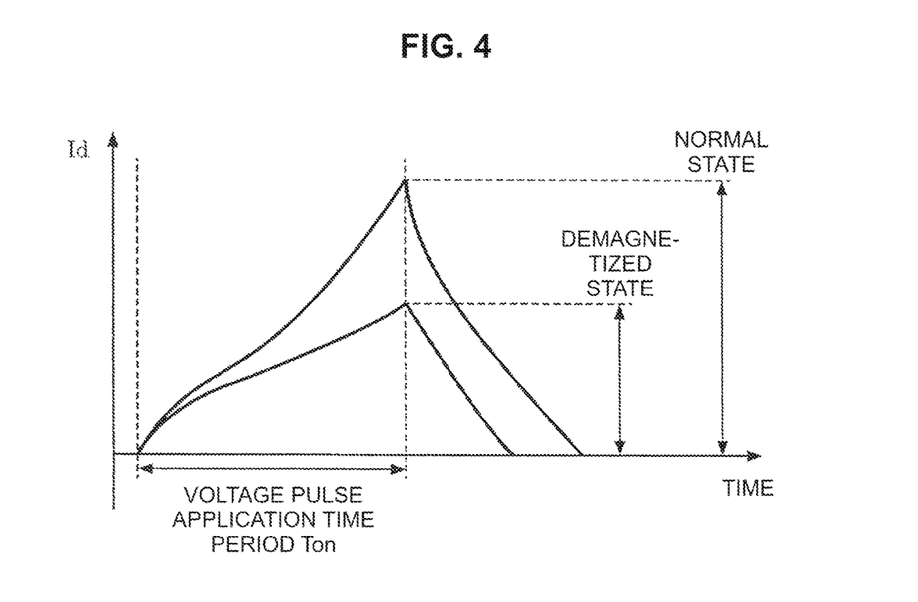
FIG. 4 is a graph showing relation between voltage pulse application time period and d-axis current, in cases of a normal state and a demagnetized state.

In view of the inductance characteristic above and the mathematical expression (3), d-axis current Id is calculated by time integration of the mathematical expression (3), and varies depending on magnetic flux of the magnet as shown in FIG. 4 when regarding the time period Ton for pulse voltage application in a direction of the d-axis as a constant. Thus, d-axis current Id decreases with increase in demagnetization factor. Accordingly, demagnetization determiner 10 diagnoses demagnetization as occurring and raises an alarm, in response to a value of d-axis current Id equal to or less than a demagnetization determination threshold.

However, when rotor phase γ has a value corresponding to a phase of a voltage vector Vn being one of the twelve voltage vectors in the d-axis direction, the rotor phase corresponding to the voltage vector Vn exists within a range of Vn−15°<γ<Vn+15°. Accordingly, the more the rotor phase γ becomes distant from any voltage vector Vn, the more the voltage is applied also to a direction of the q-axis. This causes current to flow also in the q-axis direction, against the original intention to let current flow only in the d-axis direction.

Thus, d-axis current Id varies depending on position of rotor phase γ even under application of the voltage vector command V+*. In case of rotor phase satisfying γ=Vn±15° at which d-axis current Id becomes minimum, d-axis current Id has a value of approximately 96.6% in comparison with a case of rotor phase satisfying γ=Vn. Such variation in value of d-axis current Id depending on rotor phase γ may affect the demagnetization diagnosis.

In order to suppress the variation in current depending on rotor phase γ, pulse voltage application time period Ton is corrected based on rotor phase γ. The mathematical expression (5) below shows corrected pulse voltage application time period Ton'.

[Mathematical Expression 5]

$$Ton'=Ton/\cos(\Delta\theta) \quad (5)$$

Ton Before-correction pulse voltage application time period (fixed value)
Ton': Corrected pulse voltage application time period
Δθ: Absolute value of difference between current rotor phase γ and phase of voltage vector command For example, in case that the voltage vector V2 has been selected for the voltage vector command V+* under rotor phase γ=28°, the voltage vector command V+* has a phase of 30° as shown in FIG. 2, and the above Δθ is calculated as Δθ=|28°−30°|=2°.

It is allowed to set d-axis current Id to flow independently of position of rotor phase γ, by correcting the pulse voltage application time period Ton with the mathematical expression (5) and outputting the voltage vector command V+* for the corrected pulse voltage application time period Ton'.

As described above, the first embodiment discloses accurately measuring d-axis current Id used for the demagnetization diagnosis, independently of rotor phase γ during the demagnetization diagnosis, by correcting pulse voltage application time period Ton with use of the mathematical expression (5) in pulse voltage generator 7. This serves to improve accuracy of the demagnetization diagnosis.

[Second Embodiment] The first embodiment is configured to compare the value of d-axis current Id with the demagnetization determination threshold. Whereas, the second embodiment is configured to perform the demagnetization diagnosis by comparing an effective value $I1=\sqrt{(Id^2+Iq^2)}$ of alternating current with the demagnetization determination threshold. The following describes points at which the second embodiment is different from the first embodiment.

As described above, q-axis current Iq satisfies Iq≈0 during operation of the demagnetization determination. In addition, alternating-current effective value $I1=\sqrt{(Id^2+Iq^2)}$ varies depending on position of rotor phase γ, because d-axis inductance Ld and q-axis inductance Lq are not equivalent to each other.

In this case, corrected pulse voltage application time period Ton' is expressed by the following mathematical expression (6).

[Mathematical Expression 6]

$$Ton' = \frac{Ton}{\sqrt{\cos^2(\Delta\theta) + \left(\frac{Ld}{Lq}*\sin(\Delta\theta)\right)^2}} \quad (6)$$

Ton: Pulse voltage application time period before correction (fixed value)
Ton': Pulse voltage application time period after correction
Δθ: Absolute value of difference between current rotor phase γ and phase of voltage vector command
Ld: d-axis inductance
Lq: q-axis inductance Demagnetization determiner 10 may perform the demagnetization determination based on comparison between the demagnetization determination threshold and a peak current of a waveform of alternating-current effective value $I1=\sqrt{(Id^2+Iq^2)}$ instead of d-axis current Id, where the peak current is a current at a timing after the corrected pulse voltage application time period has passed from a start of output of the voltage vector command V+*. In such case, three-phase/two-phase converter 9 shown in FIG. 1 outputs d-axis current Id and q-axis current Iq to demagnetization determiner 10.

As described above, the second embodiment achieves the effects similar to the first embodiment.

[Third Embodiment] The third embodiment is configured to correct the demagnetization determination threshold of demagnetization determiner 10 in view of temperature of the magnet, because magnetic flux of the magnet varies depending on temperature of the magnet. The demagnetization determination threshold is corrected by: expressing beforehand a relation between magnet temperature and magnet magnetic flux as a mathematical expression; and appropriately calculating the demagnetization determination threshold from an inputted value of magnet temperature. In case that the calculation is complicated, the demagnetization determination threshold may be changed by reference to a table that is prepared to include values of magnet magnetic flux corresponding to values of magnet temperature within a range of use.

The third embodiment may be applied in addition to the first embodiment or the second embodiment.

As described above, the third embodiment is configured to correct the demagnetization determination threshold in view of variation in magnet temperature, and thereby serves to improve accuracy of the demagnetization diagnosis in addition to the effects of the first and second embodiments.

[Fourth Embodiment] Each of the first to third embodiments is configured to improve accuracy in measurement of d-axis current Id used for the demagnetization diagnosis, independently of rotor phase γ during the demagnetization diagnosis, by correcting pulse voltage application time period Ton in view of rotor phase γ. This serves to improve accuracy of the demagnetization diagnosis.

However, each of the first to third embodiments requires direct-current voltage inputted to the inverter (i.e., direct-current voltage VDC of capacitor C in FIG. 6) to be always constant as a precondition for the demagnetization diagnosis with high accuracy, because each of the first to third embodiments is configured to apply pulse voltage (i.e., d-axis voltage) Vd for the predetermined time period and implement the demagnetization diagnosis based on a value of d-axis current Id on that occasion. Accordingly, the first to third embodiments may be impractical in an environment in which the voltage supplied to inverter 3 changes due to changes in charge state of battery 1, power consumption of the other components, ambient temperature, etc.

The fourth embodiment is configured to correct pulse voltage application time period Ton in pulse voltage generator 7 in view of direct-current voltage VDC, because d-axis voltage Vd depends on direct-current voltage VDC.

Direct-current voltage VDC and pulse voltage (i.e., d-axis voltage) Vd have therebetween a relation shown in the following mathematical expression (7) provided that rotor phase γ has a fixed value.

[Mathematical Expression 7]

$$Vd = VDC * \cos(\Delta\theta) \quad (7)$$

From the mathematical expression (7), pulse voltage application time period Ton can be corrected by the following mathematical expression (8) in which pulse voltage application time period is in inverse proportion to measured value VDC' of direct-current voltage.

[Mathematical Expression 8]

$$Ton'' = Ton * VDC/VDC' \quad (8)$$

Ton Pulse voltage application time period before correction (fixed value)
Ton'': Pulse voltage application time period after correction
VDC Direct-current voltage reference value (fixed value)
VDC': Direct-current voltage measured value The direct-current voltage reference value (fixed value) is set to a direct-current voltage in a rated operational state of the in-vehicle motor drive system.

Demagnetization determiner 10 may compare d-axis current Id with the demagnetization determination threshold, or compare alternating-current effective value $I1=\sqrt{(Id^2+Iq^2)}$ with the demagnetization determination threshold. The other controls are same with the first and second embodiments.

In case that direct-current voltage VDC varies through a wide range and simultaneously pulse voltage application time period Ton is not sufficiently greater than a dead time, pulse voltage application time period Ton conspicuously varies depending on the dead time. This requires pulse voltage application time period to be corrected beforehand in view of the dead time.

The fourth embodiment serves to further improve accuracy of the demagnetization, in combination with the first to third embodiments.

In such cases, the corrected pulse voltage application time period Ton" is obtained by substituting the corrected pulse voltage application time period Ton', which is calculated by the mathematical expression (5) or (6), for the before-correction pulse voltage application time period Ton in the mathematical expression (8). In other words, the corrected pulse voltage application time period Ton" is obtained by multiplying the corrected pulse voltage application time period Ton', which is calculated by the mathematical expression (5) or (6), by the direct-current voltage reference value (fixed value) VDC/the direct-current voltage measured value VDC'.

As described above, the fourth embodiment is configured to correct the corrected pulse voltage application time period Ton' in view of the direct-current voltage measured value VDC', and thereby serves to further improve accuracy of the demagnetization diagnosis in addition to the effects of the first to third embodiments.

Although the above details only the recited embodiments in the present invention, it is obvious for a person skilled in the art that the embodiments may be variously changed or modified within scope of technological thoughts of the present invention. Such various changes and modifications are naturally included within scope of the present claims.

The invention claimed is:

1. A demagnetization diagnosis device for a motor, the demagnetization diagnosis device comprising:
    a power converter including: a first switch element and a second switch element connected to each other in series between a first end and a second end of a capacitor; a third switch element and a fourth switch element connected to each other in series between the first end and the second end of the capacitor; and a fifth switch element and a sixth switch element connected to each other in series between the first end and the second end of the capacitor;
    the motor including: a first winding connected to a connection point common between the first switch element and the second switch element; a second winding connected to a connection point common between the third switch element and the fourth switch element; and a third winding connected to a connection point common between the fifth switch element and the sixth switch element;
    a pulse voltage generator that calculates a corrected pulse voltage application time period by a Mathematical Expression 5 below, and selects a voltage vector nearest to a rotor phase of a rotor of the motor out of voltage vectors V1 to V12 shown in a Table 1 below, and outputs the selected voltage vector as a voltage vector command, for the corrected pulse voltage application time period;
    a current measurement circuit that measures output currents of three phases of the power converter outputted when the first to sixth switch elements of the power converter are turned ON or OFF in accordance with the Table 1 in response to the voltage vector command;
    a three-phase/two-phase converter that converts the output currents of the three phases into output currents of two phases, and outputs a d-axis current; and
    a demagnetization determiner that determines demagnetization as occurring in a permanent magnet of the rotor of the motor, in response to satisfaction of a condition that the d-axis current after passage of the corrected pulse voltage application time period is equal to or less than a demagnetization determination threshold

[Mathematical Expression 5]

$$Ton' = Ton/\cos(\Delta\theta) \quad (5)$$

Ton: Before-correction pulse voltage application time period (fixed value)
Ton': Corrected pulse voltage application time period
$\Delta\theta$: Absolute value of difference between current rotor phase $\gamma$ and phase of voltage vector command

TABLE 1

|     | FIRST SWITCH ELEMENT | SECOND SWITCH ELEMENT | THIRD SWITCH ELEMENT |
|-----|-----|-----|-----|
| V1  | ON  | OFF | OFF |
| V2  | ON  | OFF | OFF |
| V3  | ON  | OFF | ON  |
| V4  | OFF | OFF | ON  |
| V5  | OFF | ON  | ON  |
| V6  | OFF | ON  | ON  |
| V7  | OFF | ON  | ON  |
| V8  | OFF | ON  | OFF |
| V9  | OFF | ON  | OFF |
| V10 | OFF | OFF | OFF |
| V11 | ON  | OFF | OFF |
| V12 | ON  | OFF | OFF |

|     | FOURTH SWITCH ELEMENT | FIFTH SWITCH ELEMENT | SIXTH SWITCH ELEMENT |
|-----|-----|-----|-----|
| V1  | ON  | OFF | ON  |
| V2  | OFF | OFF | ON  |
| V3  | OFF | OFF | ON  |
| V4  | OFF | OFF | ON  |
| V5  | OFF | OFF | ON  |
| V6  | OFF | OFF | OFF |
| V7  | OFF | ON  | OFF |
| V8  | OFF | ON  | OFF |
| V9  | ON  | ON  | OFF |
| V10 | ON  | ON  | OFF |
| V11 | ON  | ON  | OFF |
| V12 | ON  | OFF | OFF.|

2. The demagnetization diagnosis device as claimed in claim 1, wherein the pulse voltage generator further corrects the corrected pulse voltage application time period, by multiplying the corrected pulse voltage application time period by a first value, where the first value is obtained by dividing a direct-current voltage reference value by a direct-current voltage measured value.

3. The demagnetization diagnosis device as claimed in claim 1, wherein the demagnetization determiner sets the demagnetization determination threshold, based on a temperature of a permanent magnet of the motor.

4. A demagnetization diagnosis device for a motor, the demagnetization diagnosis device comprising:
- a power converter including: a first switch element and a second switch element connected to each other in series between a first end and a second end of a capacitor; a third switch element and a fourth switch element connected to each other in series between the first end and the second end of the capacitor; and a fifth switch element and a sixth switch element connected to each other in series between the first end and the second end of the capacitor;
- the motor including: a first winding connected to a connection point common between the first switch element and the second switch element; a second winding connected to a connection point common between the third switch element and the fourth switch element; and a third winding connected to a connection point common between the fifth switch element and the sixth switch element;
- a pulse voltage generator that calculates a corrected pulse voltage application time period by a Mathematical Expression 6 below, and selects a voltage vector nearest to a rotor phase of a rotor of the motor out of voltage vectors V1 to V12 shown in a Table 1 below, and outputs the selected voltage vector as a voltage vector command, for the corrected pulse voltage application time period;
- a current measurement circuit that measures output currents of three phases of the power converter outputted when the first to sixth switch elements of the power converter are turned ON or OFF in accordance with the Table 1 in response to the voltage vector command;
- a three-phase/two-phase converter that converts the output currents of the three phases into output currents of two phases, and outputs a d-axis current and a q-axis current; and
- a demagnetization determiner that determines demagnetization as occurring in a permanent magnet of the rotor of the motor, in response to satisfaction of a condition that an alternating-current effective value calculated from the d-axis current and the q-axis current after passage of the corrected pulse voltage application time period is equal to or less than a demagnetization determination threshold

[Mathematical Expression 6]

$$Ton' = \frac{Ton}{\sqrt{\cos^2(\Delta\theta) + \left(\frac{Ld}{Lq} * \sin(\Delta\theta)\right)^2}} \quad (6)$$

Ton: Pulse voltage application time period before correction (fixed value)

Ton': Pulse voltage application time period after correction

Δθ: Absolute value of difference between current rotor phase γ and phase of voltage vector command Ld: d-axis inductance Lq: q-axis inductance

TABLE 1

|     | FIRST SWITCH ELEMENT | SECOND SWITCH ELEMENT | THIRD SWITCH ELEMENT | FOURTH SWITCH ELEMENT | FIFTH SWITCH ELEMENT | SIXTH SWITCH ELEMENT |
|-----|---|---|---|---|---|---|
| V1  | ON  | OFF | OFF | ON  | OFF | ON  |
| V2  | ON  | OFF | OFF | OFF | OFF | ON  |
| V3  | ON  | OFF | ON  | OFF | OFF | ON  |
| V4  | OFF | OFF | ON  | OFF | OFF | ON  |
| V5  | OFF | ON  | ON  | OFF | OFF | ON  |
| V6  | OFF | ON  | ON  | OFF | OFF | OFF |
| V7  | OFF | ON  | ON  | OFF | ON  | OFF |
| V8  | OFF | ON  | OFF | OFF | ON  | OFF |
| V9  | OFF | ON  | OFF | ON  | ON  | OFF |
| V10 | OFF | OFF | OFF | ON  | ON  | OFF |
| V11 | ON  | OFF | OFF | ON  | ON  | OFF |
| V12 | ON  | OFF | OFF | ON  | OFF | OFF |

5. A demagnetization diagnosis device for a motor, the demagnetization diagnosis device comprising:
- a power converter including: a first switch element and a second switch element connected to each other in series between a first end and a second end of a capacitor; a third switch element and a fourth switch element connected to each other in series between the first end and the second end of the capacitor; and a fifth switch element and a sixth switch element connected to each other in series between the first end and the second end of the capacitor;
- the motor including: a first winding connected to a connection point common between the first switch element and the second switch element; a second winding connected to a connection point common between the third switch element and the fourth switch element; and a third winding connected to a connection point common between the fifth switch element and the sixth switch element;
- a pulse voltage generator that calculates a corrected pulse voltage application time period by a Mathematical Expression 8 below, and selects a voltage vector nearest to a rotor phase of a rotor of the motor out of voltage vectors V1 to V12 shown in a Table 1 below, and outputs the selected voltage vector as a voltage vector command, for the corrected pulse voltage application time period;

a current measurement circuit that measures output currents of three phases of the power converter outputted when the first to sixth switch elements of the power converter are turned ON or OFF in accordance with the Table 1 in response to the voltage vector command;

a three-phase/two-phase converter that converts the output currents of the three phases into output currents of two phases, and outputs a d-axis current or both of the d-axis current and a q-axis current; and a demagnetization determiner that determines demagnetization as occurring in a permanent magnet of the rotor of the motor, in response to satisfaction of a condition that the d-axis current or an alternating-current effective value calculated from the d-axis current and the q-axis current after passage of the corrected pulse voltage application time period is equal to or less than a demagnetization determination threshold

[Mathematical Expression 8]

$$Ton'' = Ton * VDC / VDC' \qquad (8)$$

Ton: Pulse voltage application time period before correction (fixed value)
Ton'': Pulse voltage application time period after correction
VDC: Direct-current voltage reference value (fixed value)
VDC': Direct-current voltage measured value a motor including: a first winding connected to a connection point common between the first switch element and the second switch element; a second winding connected to a connection point common between the third switch element and the fourth switch element; and a third winding connected to a connection point common between the fifth switch element and the sixth switch element, the demagnetization diagnosis method comprising:

with use of a pulse voltage generator, calculating a corrected pulse voltage application time period by a Mathematical Expression 5 below, and selecting a voltage vector nearest to a rotor phase of a rotor of the motor out of voltage vectors V1 to V12 shown in a Table 1 below, and outputting the selected voltage vector as a voltage vector command, for the corrected pulse voltage application time period;

with use of a current measurement circuit, measuring output currents of three phases of the power converter outputted when the first to sixth switch elements of the power converter are turned ON or OFF in accordance with the Table 1 in response to the voltage vector command; with use of a three-phase/two-phase converter, converting the output currents of the three phases into output currents of two phases, and outputting a d-axis current; and with use of a demagnetization determiner, determining demagnetization as occurring in a permanent magnet of the rotor of the motor, in response to satisfaction of a condition that the d-axis current after passage of the corrected pulse voltage application time period is equal to or less than a demagnetization determination threshold

[Mathematical Expression 5]

$$Ton' = Ton / \cos(\Delta\theta) \qquad (5)$$

Ton: Before-correction pulse voltage application time period (fixed value)
Ton': Corrected pulse voltage application time period
$\Delta\theta$: Absolute value of difference between current rotor phase Y and phase of voltage vector command

TABLE 1

|  | FIRST SWITCH ELEMENT | SECOND SWITCH ELEMENT | THIRD SWITCH ELEMENT | FOURTH SWITCH ELEMENT | FIFTH SWITCH ELEMENT | SIXTH SWITCH ELEMENT |
| --- | --- | --- | --- | --- | --- | --- |
| V1 | ON | OFF | OFF | ON | OFF | ON |
| V2 | ON | OFF | OFF | OFF | OFF | ON |
| V3 | ON | OFF | ON | OFF | OFF | ON |
| V4 | OFF | OFF | ON | OFF | OFF | ON |
| V5 | OFF | ON | ON | OFF | OFF | ON |
| V6 | OFF | ON | ON | OFF | OFF | OFF |
| V7 | OFF | ON | ON | OFF | ON | OFF |
| V8 | OFF | ON | OFF | OFF | ON | OFF |
| V9 | OFF | ON | OFF | ON | ON | OFF |
| V10 | OFF | OFF | OFF | ON | ON | OFF |
| V11 | ON | OFF | OFF | ON | ON | OFF |
| V12 | ON | OFF | OFF | ON | OFF | OFF. |

6. A demagnetization diagnosis method for a motor control device, wherein the motor control device includes:

a power converter including: a first switch element and a second switch element connected to each other in series between a first end and a second end of a capacitor; a third switch element and a fourth switch element connected to each other in series between the first end and the second end of the capacitor; and a fifth switch element and a sixth switch element connected to each other in series between the first end and the second end of the capacitor; and

TABLE 1

|  | FIRST SWITCH ELEMENT | SECOND SWITCH ELEMENT | THIRD SWITCH ELEMENT | FOURTH SWITCH ELEMENT | FIFTH SWITCH ELEMENT | SIXTH SWITCH ELEMENT |
|---|---|---|---|---|---|---|
| V1 | ON | OFF | OFF | ON | OFF | ON |
| V2 | ON | OFF | OFF | OFF | OFF | ON |
| V3 | ON | OFF | ON | OFF | OFF | ON |
| V4 | OFF | OFF | ON | OFF | OFF | ON |
| V5 | OFF | ON | ON | OFF | OFF | ON |
| V6 | OFF | ON | ON | OFF | OFF | OFF |
| V7 | OFF | ON | ON | OFF | ON | OFF |
| V8 | OFF | ON | OFF | OFF | ON | OFF |
| V9 | OFF | ON | OFF | ON | ON | OFF |
| V10 | OFF | OFF | OFF | ON | ON | OFF |
| V11 | ON | OFF | OFF | ON | ON | OFF |
| V12 | ON | OFF | OFF | ON | OFF | OFF. |

7. A demagnetization diagnosis method for a motor control device, wherein the motor control device includes:
a power converter including: a first switch element and a second switch element connected to each other in series between a first end and a second end of a capacitor; a third switch element and a fourth switch element connected to each other in series between the first end and the second end of the capacitor; and a fifth switch element and a sixth switch element connected to each other in series between the first end and the second end of the capacitor; and
a motor including: a first winding connected to a connection point common between the first switch element and the second switch element; a second winding connected to a connection point common between the third switch element and the fourth switch element; and a third winding connected to a connection point common between the fifth switch element and the sixth switch element;
the demagnetization diagnosis method comprising:
with use of a pulse voltage generator, calculating a corrected pulse voltage application time period by a Mathematical Expression 6 below, and selecting a voltage vector nearest to a rotor phase of a rotor of the motor out of voltage vectors V1 to V12 shown in a Table 1 below, and outputting the selected voltage vector as a voltage vector command, for the corrected pulse voltage application time period;
with use of a current measurement circuit, measuring output currents of three phases of the power converter outputted when the first to sixth switch elements of the power converter are turned ON or OFF in accordance with the Table 1 in response to the voltage vector command; with use of a three-phase/two-phase converter, converting the output currents of the three phases into output currents of two phases, and outputting a d-axis current and a q-axis current; and with use of a demagnetization determiner, determining demagnetization as occurring in a permanent magnet of the rotor of the motor, in response to satisfaction of a condition that an alternating-current effective value calculated from the d-axis current and the q-axis current after passage of the corrected pulse voltage application time period is equal to or less than a demagnetization determination threshold

[Mathematical Expression 6]

$$Ton' = \frac{Ton}{\sqrt{\cos^2(\Delta\theta) + \left(\frac{Ld}{Lq} * \sin(\Delta\theta)\right)^2}} \quad (6)$$

Ton: Pulse voltage application time period before correction (fixed value)
Ton': Pulse voltage application time period after correction
$\Delta\theta$: Absolute value of difference between current rotor phase $\gamma$ and phase of voltage vector command
Ld: d-axis inductance
Lq q-axis inductance

TABLE 1

|  | FIRST SWITCH ELEMENT | SECOND SWITCH ELEMENT | THIRD SWITCH ELEMENT | FOURTH SWITCH ELEMENT | FIFTH SWITCH ELEMENT | SIXTH SWITCH ELEMENT |
|---|---|---|---|---|---|---|
| V1 | ON | OFF | OFF | ON | OFF | ON |
| V2 | ON | OFF | OFF | OFF | OFF | ON |
| V3 | ON | OFF | ON | OFF | OFF | ON |
| V4 | OFF | OFF | ON | OFF | OFF | ON |
| V5 | OFF | ON | ON | OFF | OFF | ON |
| V6 | OFF | ON | ON | OFF | OFF | OFF |
| V7 | OFF | ON | ON | OFF | ON | OFF |
| V8 | OFF | ON | OFF | OFF | ON | OFF |
| V9 | OFF | ON | OFF | ON | ON | OFF |
| V10 | OFF | OFF | OFF | ON | ON | OFF |
| V11 | ON | OFF | OFF | ON | ON | OFF |
| V12 | ON | OFF | OFF | ON | OFF | OFF. |

8. A demagnetization diagnosis method for a motor control device, wherein the motor control device includes:
- a power converter including: a first switch element and a second switch element connected to each other in series between a first end and a second end of a capacitor; a third switch element and a fourth switch element connected to each other in series between the first end and the second end of the capacitor; and a fifth switch element and a sixth switch element connected to each other in series between the first end and the second end of the capacitor; and
- a motor including: a first winding connected to a connection point common between the first switch element and the second switch element; a second winding connected to a connection point common between the third switch element and the fourth switch element; and a third winding connected to a connection point common between the fifth switch element and the sixth switch element;

the demagnetization diagnosis method comprising:
- with use of a pulse voltage generator, calculating a corrected pulse voltage application time period by a Mathematical Expression 8 below, and selecting a voltage vector nearest to a rotor phase of a rotor of the motor out of voltage vectors V1 to V12 shown in a Table 1 below, and outputting the selected voltage vector as a voltage vector command, for the corrected pulse voltage application time period;
- with use of a current measurement circuit, measuring output currents of three phases of the power converter outputted when the first to sixth switch elements of the power converter are turned ON or OFF in accordance with the Table 1 in response to the voltage vector command;
- with use of a three-phase/two-phase converter, converting the output currents of the three phases into output currents of two phases, and outputting a d-axis current or both of the d-axis current and a q-axis current; and
- with use of a demagnetization determiner, determining demagnetization as occurring in a permanent magnet of the rotor of the motor, in response to satisfaction of a condition that the d-axis current or an alternating-current effective value calculated from the d-axis current and the q-axis current after passage of the corrected pulse voltage application time period is equal to or less than a demagnetization determination threshold

[Mathematical Expression 8]

$$Ton'' = Ton * VDC/VDC' \tag{8}$$

Ton: Pulse voltage application time period before correction (fixed value)

Ton'': Pulse voltage application time period after correction

VDC: Direct-current voltage reference value (fixed value)

VDC': Direct-current voltage measured value

TABLE 1

|  | FIRST SWITCH ELEMENT | SECOND SWITCH ELEMENT | THIRD SWITCH ELEMENT | FOURTH SWITCH ELEMENT | FIFTH SWITCH ELEMENT | SIXTH SWITCH ELEMENT |
|---|---|---|---|---|---|---|
| V1 | ON | OFF | OFF | ON | OFF | ON |
| V2 | ON | OFF | OFF | OFF | OFF | ON |
| V3 | ON | OFF | ON | OFF | OFF | ON |
| V4 | OFF | OFF | ON | OFF | OFF | ON |
| V5 | OFF | ON | ON | OFF | OFF | ON |
| V6 | OFF | ON | ON | OFF | OFF | OFF |
| V7 | OFF | ON | ON | OFF | ON | OFF |
| V8 | OFF | ON | OFF | OFF | ON | OFF |
| V9 | OFF | ON | OFF | ON | ON | OFF |
| V10 | OFF | OFF | OFF | ON | ON | OFF |
| V11 | ON | OFF | OFF | ON | ON | OFF |
| V12 | ON | OFF | OFF | ON | OFF | OFF. |

* * * * *